(12) United States Patent
Sakai et al.

(10) Patent No.: US 12,429,500 B2
(45) Date of Patent: Sep. 30, 2025

(54) ANALYSIS APPARATUS, ANALYSIS METHOD, AND RECORDING MEDIUM HAVING RECORDED THEREON ANALYSIS PROGRAM

(71) Applicant: ADVANTEST CORPORATION, Tokyo (JP)

(72) Inventors: Yuji Sakai, Tokyo (JP); Hajime Sugimura, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 651 days.

(21) Appl. No.: 17/202,373

(22) Filed: Mar. 16, 2021

(65) Prior Publication Data

US 2021/0199693 A1    Jul. 1, 2021

Related U.S. Application Data

(63) Continuation of application No. PCT/JP2019/013037, filed on Mar. 26, 2019.

(30) Foreign Application Priority Data

Oct. 12, 2018   (JP) .................... 2018-193304

(51) Int. Cl.
   *G01R 1/067*      (2006.01)
   *G01R 31/28*      (2006.01)
   *G06N 20/00*      (2019.01)

(52) U.S. Cl.
   CPC ..... *G01R 1/06794* (2013.01); *G01R 31/2831* (2013.01); *G06N 20/00* (2019.01)

(58) Field of Classification Search
   CPC . G01R 1/06794; G01R 31/2831; G06N 20/00
   (Continued)

(56) References Cited

U.S. PATENT DOCUMENTS 7,351,591 B2 *   4/2008   Koo ..................... G01N 21/658
                                                    436/524
7,351,597 B2 *   4/2008   Wada ................. G01R 1/07314
                                                    257/48
(Continued)

FOREIGN PATENT DOCUMENTS

CN        101086974 A      12/2007
CN        101261307 A       9/2008
(Continued)

OTHER PUBLICATIONS

Office Action issued for counterpart Korean Application 10-2021-7008749, issued by the Korean Intellectual Property Office on Oct. 25, 2022.

(Continued)

*Primary Examiner* — Aditya S Bhat

(57) ABSTRACT

In order to analyze a plurality of measured values obtained by measuring a device under measurement and to effectively use the analyzed information, there is provided a recording medium having recorded thereon an analysis apparatus, the analysis apparatus including: an acquisition unit configured to acquire the plurality of measured values obtained by measuring the device under measurement via a jig; an analysis unit configured to analyze the plurality of measured values to calculate variation data which indicates a variation of a measured value in accordance with the number of times of contacts that the jig comes into contact with the device under measurement; and a management unit configured to manage a state of the jig based on the variation data.

18 Claims, 7 Drawing Sheets

(58) Field of Classification Search
USPC .......................................................... 702/58
See application file for complete search history.

(56) References Cited

U.S. PATENT DOCUMENTS

| | | |
|---|---|---|
| 2002/0111759 A1 | 8/2002 | Koyama |
| 2004/0229388 A1 | 11/2004 | Guldi |
| 2005/0015736 A1 | 1/2005 | Okuno |
| 2005/0017747 A1 | 1/2005 | Muller |
| 2005/0093565 A1* | 5/2005 | Okamoto ................ H01L 22/14 324/755.09 |
| 2005/0116734 A1* | 6/2005 | Savagaonkar ..... G01R 31/2886 324/754.03 |
| 2006/0279304 A1 | 12/2006 | Kuitani |
| 2007/0067678 A1 | 3/2007 | Hosek |
| 2011/0208680 A1 | 8/2011 | Bovey |
| 2012/0123734 A1 | 5/2012 | Linde |
| 2012/0316835 A1 | 12/2012 | Maeda |
| 2018/0173207 A1 | 6/2018 | Morimoto |
| 2019/0171199 A1 | 6/2019 | Unuma |
| 2019/0295908 A1* | 9/2019 | Rathert ................... H01L 22/20 |
| 2019/0302170 A1* | 10/2019 | Kanai .................... G01R 31/26 |
| 2020/0011927 A1 | 1/2020 | Kagami |
| 2021/0199713 A1* | 7/2021 | Sakai ................. G01R 31/2894 |

FOREIGN PATENT DOCUMENTS

| | | |
|---|---|---|
| CN | 101324652 A | 12/2008 |
| CN | 102928761 A | 2/2013 |
| CN | 105300333 A | 2/2016 |
| JP | 2000088886 A | 3/2000 |
| JP | 2003282654 A | 10/2003 |
| JP | 2005051210 A | 2/2005 |
| JP | 2008098230 A | 4/2008 |
| JP | 2009500767 A | 1/2009 |
| JP | 2009290032 A | 12/2009 |
| JP | 2011145846 A | 7/2011 |
| JP | 2012504810 A | 2/2012 |
| JP | 2016218961 A | 12/2016 |
| JP | 2017183624 A | 10/2017 |
| JP | 2018147959 A | 9/2018 |
| KR | 20110091111 A | 8/2011 |
| KR | 20140029236 A | 3/2014 |
| KR | 101887118 B1 | 8/2018 |
| TW | 588424 B | 5/2004 |
| WO | 2018042616 A1 | 3/2018 |

OTHER PUBLICATIONS (ISA/237) Written Opinion of the International Search Authority for International Patent Application No. PCT/JP2019/013037, issued/mailed by the Japan Patent Office on Jun. 4, 2019.

Jerry J Broz, "Novel Methodologies for Assessing. On-line Probe Process Parameters. Awarded" "Most Inspirational Presentation at SWTW-2006". 2006 SouthWest Workshop. Jun. 11 to 14, 2006., pp. 1-36.

Office Action issued for counterpart Chinese Application 201980062850. 5, issued by The State Intellectual Property Office of People's Republic of China on Dec. 6, 2023.

Office Action issued for related Chinese Application 201980062862. 8, issued by The State Intellectual Property Office of People's Republic of China on Nov. 23, 2023.

Office Action issued for related Chinese Application 201980062862. 8, issued by The State Intellectual Property Office of People's Republic of China on Mar. 19, 2024.

Office Action issued for related U.S. Appl. No. 17/202,380, issued by the US Patent and Trademark Office filed Apr. 18, 2024.

Office Action issued for related U.S. Appl. No. 17/202,380, issued by the US Patent and Trademark Office filed Jan. 24, 2025.

Advisory Action issued for related U.S. Appl. No. 17/202,380, issued by the US Patent and Trademark Office filed Dec. 6, 2024.

* cited by examiner

ANALYSIS APPARATUS, ANALYSIS METHOD, AND RECORDING MEDIUM HAVING RECORDED THEREON ANALYSIS PROGRAM

The contents of the following Japanese patent application are incorporated herein by reference:
NO. 2018-193304 filed in JP on Oct. 12, 2018
NO. PCT/JP2019/013037 filed in WO on Mar. 26, 2019.

BACKGROUND

1. Technical Field

The present invention relates to an analysis apparatus, an analysis method, and a recording medium having recorded thereon an analysis program.

2. Related Art

In the related art, a test apparatus that performs, when measuring a device under measurement, a measurement by bringing a jig into contact with the device under measurement is known.

However, a state of a measurement system for measuring the device under measurement is not always constant, and varies due to various factors. Accordingly, it is desirable to analyze information obtained from the measurement system and to manage the measurement system.

General Disclosure

In order to solve the above problem, a first aspect of the present invention provides an analysis apparatus. The analysis apparatus may include an acquisition unit configured to acquire a plurality of measured values obtained by measuring a device under measurement via a jig. The analysis apparatus may include an analysis unit configured to analyze the plurality of measured values to calculate variation data which indicates a variation of a measured value in accordance with the number of times of contacts that the jig comes into contact with the device under measurement. The analysis apparatus may include a management unit configured to manage a state of the jig based on the variation data.

The acquisition unit may be configured to acquire the plurality of measured values which are measured at different positions in the device under measurement, and the analysis unit may be configured to separate, from the plurality of measured values, a position-dependent component that depends on a measured position in the device under measurement, and to extract the variation of the measured value in accordance with the number of times of the contacts.

The position-dependent component may include a component that changes concentrically from the center of the device under measurement.

The position-dependent component may include at least any one of a component that depends on one coordinate axis direction in a coordinate plane, and a component that depends on the other coordinate axis direction in the coordinate plane, when the device under measurement is arranged on the coordinate plane.

The device under measurement may be a wafer in which a plurality of device regions are formed, and the acquisition unit may be configured to acquire at least any one of the plurality of measured values obtained by measuring each of the device regions, and the plurality of measured values obtained by measuring each of region blocks including the plurality of device regions.

The device under measurement may include a plurality of devices under measurement, and the acquisition unit may be configured to acquire the plurality of measured values obtained by measuring the plurality of devices under measurement at different positions in the jig, and the analysis unit may be configured to separate, from the plurality of measured values, a position-dependent component that depends on a measured position in the jig, and to extract the variation of the measured value in accordance with the number of times of the contacts.

The analysis apparatus may further include a machine learning unit configured to use the plurality of measured values to learn, by machine learning, a model of the position dependent component, and the analysis unit may be configured to separate the position-dependent component which is calculated by using the model learned by the machine learning unit.

The analysis unit may be configured to analyze the plurality of measured values to estimate a contact resistance of the jig, and the management unit may be configured to manage the state of the jig based on the contact resistance of the jig estimated by the analysis unit.

The analysis unit may be configured to analyze the plurality of measured values to calculate a variance of the contact resistance in accordance with the number of times of the contacts, and the management unit may be configured to manage the state of the jig based on the variance of the contact resistance which is calculated by the analysis unit and is in accordance with the number of times of the contacts.

The management unit may be configured to determine at least any one of a time to clean the jig and a time to replace the jig based on the variation data.

A second aspect of the present invention provides an analysis method in which an analysis apparatus performs an analysis. The analysis method may include acquiring, by the analysis apparatus, a plurality of measured values obtained by measuring a device under measurement via a jig. The analysis method may include analyzing, by the analysis apparatus, the plurality of measured values to generate variation data which indicates a variation of a measured value in accordance with the number of times of contacts that the jig comes into contact with the device under measurement. The analysis method may include managing, by the analysis apparatus, a state of the jig based on the variation data.

A third aspect of the present invention provides a recording medium having recorded thereon an analysis program. The analysis program may be executed by a computer. The analysis program may cause the computer to function as an acquisition unit configured to acquire a plurality of measured values obtained by measuring a device under measurement via a jig. The analysis program may cause the computer to function as an analysis unit configured to analyze the plurality of measured values to generate variation data which indicates a variation of a measured value in accordance with the number of times of contacts that the jig comes into contact with the device under measurement. The analysis program may cause the computer to function as a management unit configured to manage a state of the jig based on the variation data.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments of the invention, but the following embodiments do not limit the invention according to claims. Further, not all of the combinations of features described in the embodiments are essential for means to solve the problem in the invention.

Figure 1:
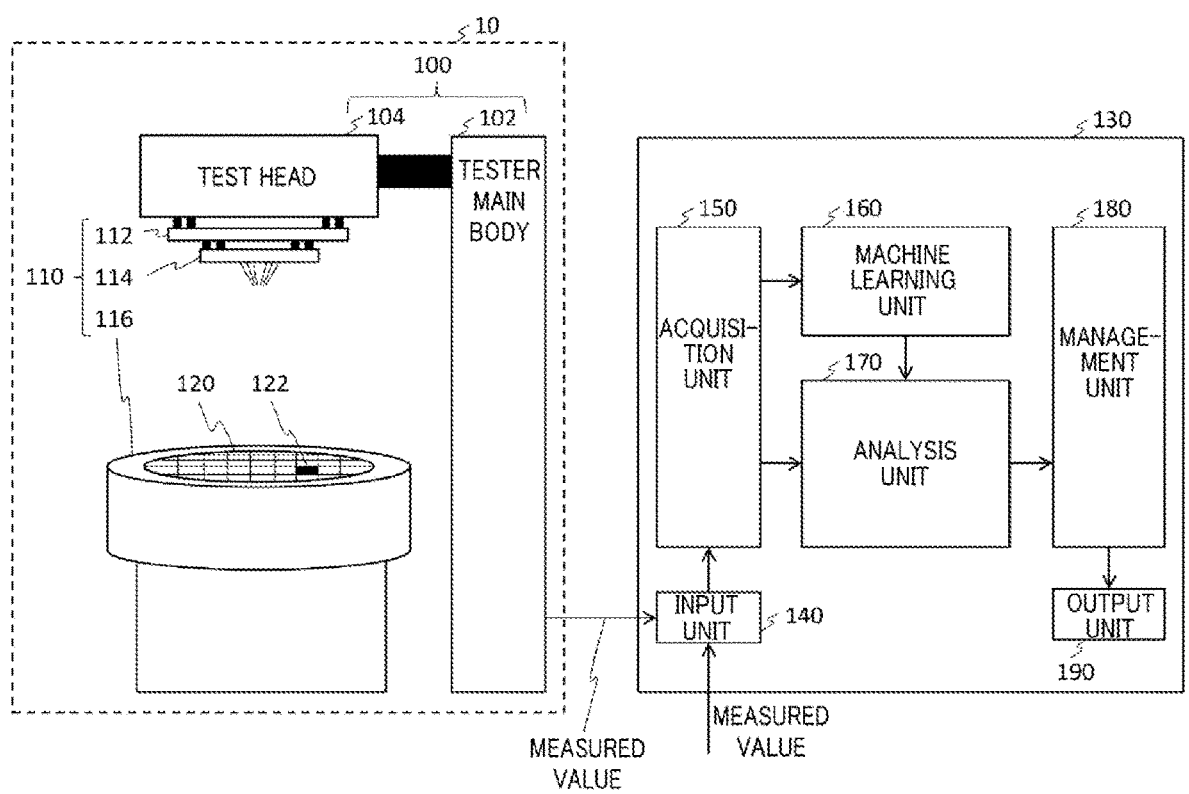
FIG. 1 shows an analysis apparatus 130 according to the present embodiment together with a measurement system 10.

FIG. 1 shows an analysis apparatus 130 according to the present embodiment together with a measurement system 10. The analysis apparatus 130 according to the present embodiment acquires and analyzes a plurality of measured values obtained by measuring a measurement target in the measurement system 10, and manages, by using the analyzed information, a degree of health and stability of a test apparatus and a jig that perform the measurement. The analysis apparatus 130 according to the present embodiment may use, as analysis targets, various measured values obtained in the measurement system 10, the measured values being, for example, a measured value obtained by testing a wafer in which a plurality of electronic devices such as semiconductors and Micro Electro Mechanical Systems (MEMS) are formed, a measured value obtained by testing a bare chip which is obtained by dicing and singulating a wafer, a measured value obtained by testing a package in which a chip is sealed, and the like. That is, the analysis apparatus 130 may use, as an analysis target, a measured value which is measured in either a so-called pre-process or a post-process. This figure shows, as an example, a case where the analysis target of the analysis apparatus 130 is a measured value obtained by testing the wafer mounted on a prober by using a tester, and this case will be described below.

The measurement system 10 has a test apparatus 100 and a jig 110. The test apparatus 100 measures a device under measurement 120 via the jig 110.

The test apparatus 100 has a tester main body 102 and a test head 104. The test apparatus 100 may be, for example, a device test apparatus such as a system LSI tester, an analog tester, a logic tester, and a memory tester. Note that the test apparatus 100 also includes a measurement apparatus that simply measures the device under measurement 120 without having a test function. The test apparatus 100 gives various test signals to the device under measurement 120 via the jig 110, and acquires a response signal from the device under measurement 120.

The tester main body 102 is a main body unit of the test apparatus 100 and controls various measurements. The tester main body 102 may have a function of outputting the plurality of measured values obtained by the various measurements to the analysis apparatus 130 according to the present embodiment via wired or wireless manner.

The test head 104 is connected to the tester main body 102 via a cable, and is configured to be drivable between a measurement position for measuring the device under measurement 120, and a retreat position. When performing the measurement, the test head 104 transmits the test signal to the device under measurement 120 at the measurement position based on the control by the tester main body 102, receives the response from the device under measurement 120, and relays the received response to the tester main body 102.

The jig 110 shows a component other than the test apparatus 100 in the measurement system 10. The jig 110 may be, for example, an interface unit that connects a measurement function of the test apparatus 100 and the device under measurement 120 when the test apparatus 100 measures the device under measurement 120. The jig 110 can be appropriately replaced according to a type of the device under measurement 120 that serves as the measurement target. In this figure, as an example, the jig 110 has a performance board 112, a probe card 114, and a prober 116. Note that when the analysis apparatus 130 according to the present embodiment sets, as the analysis target, the measured value which is measured in the post-process, the jig 110 may have a socket, a handler, and the like.

The performance board 112 is detachably attached to the test head 104 and is electrically connected to the test head 104.

The probe card 114 is detachably attached to the performance board 112 and is electrically connected to the performance board. Further, the probe card 114 has a plurality of probe needles to be brought into contact with the device under measurement 120 for electrical contact.

The prober 116 conveys and places, on a stage, the device under measurement 120, and aligns an electrode pad provided in the device under measurement 120 with the probe needle of the probe card 114. The prober 116 also has a cleaning unit for cleaning the probe needle. When the electrical connection with the device under measurement 120 is made via the probe card 114, the contact is made so as to scratch a surface of the electrode pad by the probe needle. At this time, an oxide, debris, or the like on the electrode pad is attached to a needle tip of the probe needle. Thereby, attached substances are deposited on the needle tip of the probe needle every time the contact with the electrode pad (a touchdown) is made, and an accurate measurement gradually becomes impossible. Therefore, by providing the prober 116 with the cleaning unit to polish or wash the needle tip of the probe needle, it is possible to clean the probe needle and to remove the attached substances that are deposited on the needle tip.

The device under measurement 120 is the measurement target that is placed on the stage of the prober 116 and serves as the target to be measured by the test apparatus 100. This figure shows, as an example, a case where the device under measurement 120 is a wafer in which a plurality of device regions 122 (for example, chips) are formed. A plurality of electrode pads are formed in each of the plurality of device regions 122, and the test apparatus 100 performs measurements of the plurality of device regions 122 by bringing the probe needles of the probe card 114 into contact with these electrode pads. At this time, the test apparatus 100 may measure each of the plurality of device regions 122, or may measure each of region blocks (for example, four chips) including the plurality of device regions 122. The test apparatus 100 then supplies, to the analysis apparatus 130 directly or via a network or a medium, for example, the plurality of measured values which are obtained when the device under measurement 120 is measured at different positions.

The analysis apparatus 130 acquires and analyzes the plurality of measured values obtained by measuring the device under measurement 120 in the measurement system 10. The analysis apparatus 130 may be a computer such as a PC (a personal computer), a tablet type computer, a smartphone, a workstation, a server computer, or a general-purpose computer, or may be a computer system in which a plurality of computers are connected. Such a computer system is also a computer in a broad sense. Further, the analysis apparatus 130 may be implemented by one or more virtual computer environments that can be run in the computer. Instead of this, the analysis apparatus 130 may be a dedicated computer provided to analyze the measured value, or may be dedicated hardware realized by a dedicated circuitry. As an example, the analysis apparatus 130 may be a Web server that is connected to the Internet, and in this case, a user can access, from various environments that can be connected to the Internet, the analysis apparatus 130 on the cloud to receive various services that are provided. Further, the analysis apparatus 130 may be configured as a single apparatus that is connected to the test apparatus 100 directly or via the network such as a Local Area Network (LAN), or may be configured integrally with the test apparatus 100 to be realized as a part of a functional block of the test apparatus 100. Further, as described below, for example, when the plurality of measured values are available from a direct input by a user or a storage medium such as a USB memory, the analysis apparatus 130 may not be connected to the test apparatus 100, or may be configured as an apparatus independent of the measurement system 10.

The analysis apparatus 130 includes an input unit 140, an acquisition unit 150, a machine learning unit 160, an analysis unit 170, a management unit 180, and an output unit 190.

The input unit 140 is an interface unit for inputting the plurality of measured values. The input unit 140 is, for example, connected to the tester main body 102 of the test apparatus 100 directly or via the network, and receives the plurality of measured values which are measured by the test apparatus 100. Further, the input unit 140 may be a user interface that receives the input directly from the user via a keyboard, a mouse, or the like, or may be a device interface for connecting a USB memory, a disk drive, or the like to the analysis apparatus 130, and may receive, via these interfaces, the plurality of measured values which are measured by the test apparatus 100.

The acquisition unit 150 is connected to the input unit 140, and acquires the plurality of measured values obtained by the test apparatus 100 measuring the device under measurement 120 via the jig 110. The acquisition unit 150 may acquire the plurality of measured values which are measured by the test apparatus 100 at different positions in the device under measurement 120, in more detail, the plurality of measured values which are measured by bringing the jig 110 into contact with the different positions in the device under measurement 120. For example, when the device under measurement 120 is the wafer in which the plurality of device regions 122 are formed, the acquisition unit 150 acquires at least any one of the plurality of measured values obtained by measuring each of the device regions 122 and the plurality of measured values obtained by measuring each of the region blocks including the plurality of device regions 122. The acquisition unit 150 supplies a plurality of acquired measured values to the machine learning unit 160 and the analysis unit 170. Further, instead of or in addition to this, the acquisition unit 150 may acquire the plurality of measured values obtained by measuring a plurality of devices under measurement 120 at different positions in the jig 110 when the analysis apparatus 130 sets, as the analysis target, the measured value which is measured in the post-process. For example, when the analysis apparatus 130 sets, as the analysis target, the measured value which is measured in a final test, the acquisition unit 150 may acquire the plurality of measured values obtained by respectively measuring a plurality of ICs under measurement in a plurality of sockets provided on a socket board.

The machine learning unit 160 is connected to the acquisition unit 150, and uses the plurality of measured values supplied from the acquisition unit 150, to learn, by machine learning, a model of a component included in the measured value of, for example, a position-dependent component or the like including a component that depends on a measured position in the device under measurement 120, and a component that depends on a measured position in the jig 110. This will be described below.

The analysis unit 170 is connected to the acquisition unit 150 and the machine learning unit 160, and analyzes the plurality of measured values supplied from the acquisition unit 150 to extract dispersion of the measured value. Further, the analysis unit 170 analyzes the plurality of measured values to generate variation data which indicates a variation of the measured value in accordance with the number of times of contacts that the jig 110 comes into contact with the device under measurement 120. At this time, the analysis unit 170 separates, from the plurality of measured values, for example, the position-dependent component including the component that depends on the measured position in the device under measurement 120, and the component that depends on the measured position in the jig 110. The analysis unit 170 can calculate this position dependent component by using the model learned by the machine learning unit 160.

The management unit 180 is connected to the analysis unit 170, and performs at least any one of managing a state of the jig 110 and detecting an error in the test apparatus 100 based on the plurality of measured values from which the position-dependent component is separated by the analysis unit 170. For example, the management unit 180 manages the state of the jig 110 based on the variation data generated by the analysis unit 170. Further, the management unit 180 detects the error in the test apparatus 100 based on the dispersion of the measured value extracted by the analysis unit 170. Note that here, as the state management of the jig 110, the management unit 180 can determine, for example, at least any one of a time to clean the jig 110 and a time to replace the jig 110 based on the variation data.

The output unit 190 is connected to the management unit 180, and outputs information managed by the management unit 180. The output unit 190 may cause this information to be displayed on a display unit (not shown) that is provided in the analysis apparatus 130, or may cause this information to be transmitted to another connected apparatus directly or via the network.

Figure 2:
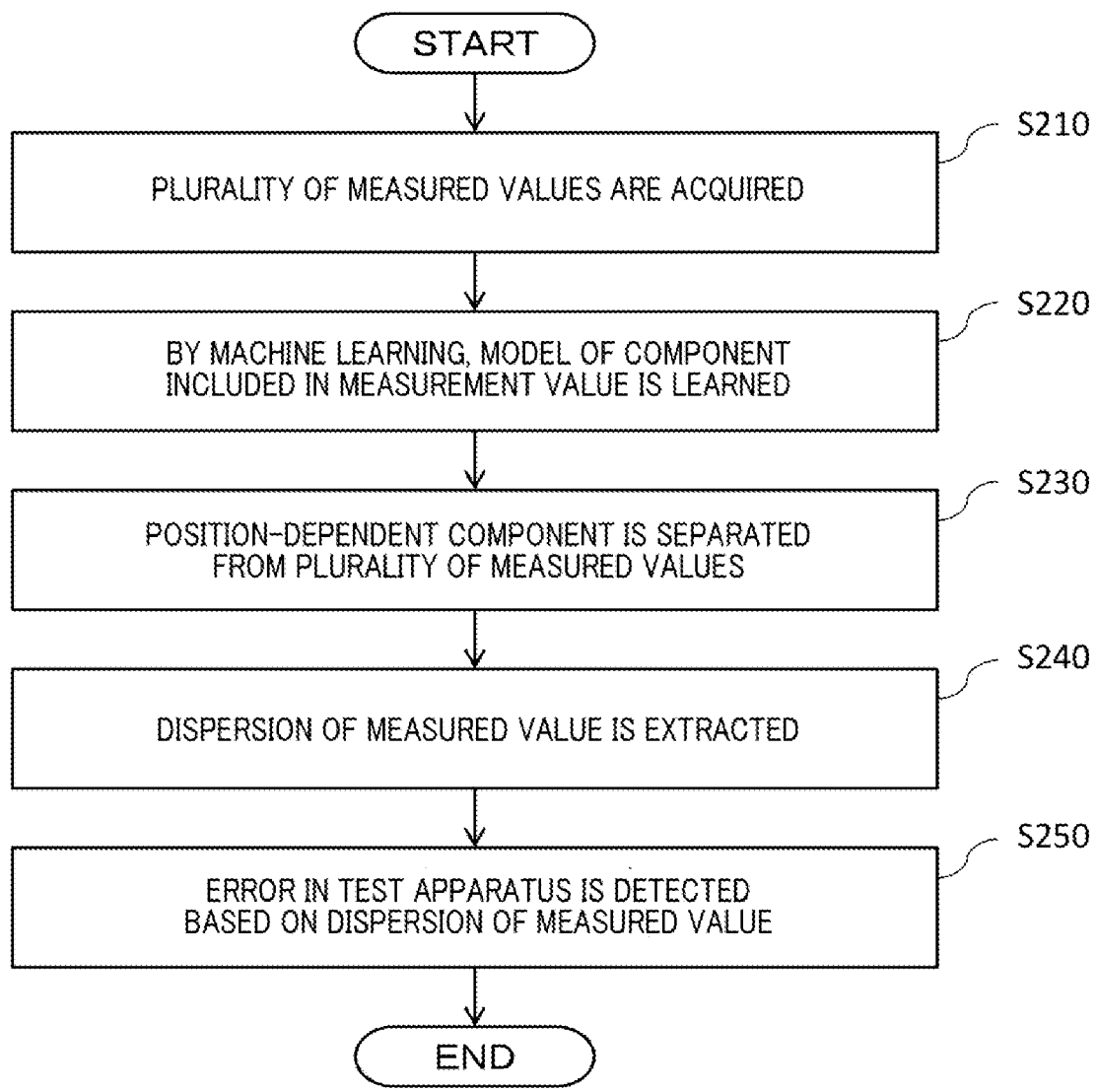
FIG. 2 shows a flow in which the analysis apparatus 130 according to the present embodiment detects an error in a test apparatus 100 based on dispersion of a measured value.

FIG. 2 shows a flow in which the analysis apparatus 130 according to the present embodiment detects an error in a test apparatus 100 based on dispersion of a measured value. In step 210, the acquisition unit 150 of the analysis apparatus 130 acquires the plurality of measured values via the input unit 140.

In step 220, the machine learning unit 160 of the analysis apparatus 130 uses the plurality of measured values acquired in step 210 to learn, by machine learning, the model of the component included in the measured value of the position-dependent component or the like. Here, as described below, the position-dependent component includes, for example, a component that changes concentrically from the center of the device under measurement 120, and a component that depends on an X axis direction and a component that depends on a Y axis direction when the device under measurement 120 is arranged on an XY plane. Further, the plurality of measured values includes a component that depends on the number of times of touchdowns as described below. The machine learning unit 160 samples the plurality of measured values to learn, by machine learning, the model of the component included in the measured value. This will be described below.

Then, in step 230, the analysis unit 170 of the analysis apparatus 130 separates, from the plurality of measured values, the position-dependent component calculated by using the model learned by the machine learning unit 160 in step 220.

Then, in step 240, the analysis unit 170 of the analysis apparatus 130 analyzes the plurality of measured values to extract the dispersion of the measured value by using the plurality of measured values from which the position-dependent component is separated in step 230. Then, the analysis unit 170 represents the dispersion of the measured value by a probability distribution to calculate the probability distribution of the measured value. For example, the analysis unit 170 assumes that the probability distribution of the measured value follows a normal distribution, and calculates an average value, standard deviation $\sigma$, and the like. Note that in the above description, the assumption is that the probability distribution of the measured value follows the normal distribution, but is not limited thereto. For example, the analysis unit 170 may assume that the probability distribution of the measured value follows another distribution such as Student's t-distribution and the Wishart distribution.

Then, in step 250, the management unit 180 of the analysis apparatus 130 detects the error in the test apparatus 100 based on the dispersion of the measured value. The management unit 180 may detect the error in the test apparatus 100 based on an outlier outside the probability distribution of the measured value calculated in step 240 from among the plurality of measured values. For example, when a value (the outlier) which is away from the average value by a predetermined multiple (for example, $2\sigma$) of the standard deviation $\sigma$ occurs with a probability higher than a predetermined criterion, in the probability distribution of the measured value, the management unit 180 may determine that some error has occurred in the test apparatus 100. As the error in the test apparatus 100, the management unit 180 may detect, for example, failures of a power source that supplies power to the device under measurement 120, a driver, an A/D converter, a D/A converter, or the like.

In this way, with the analysis apparatus 130 according to the present embodiment, the error in the test apparatus 100 is detected based on the dispersion of the measured value extracted by analyzing the plurality of measured values. In the related art, the error in the test apparatus 100 could be found only by a periodic diagnosis. However, as for a device shipped as a product, the analysis apparatus 130 according to the present embodiment can check, from a trend of a measurement result obtained during a test and a measurement, a degree of health and stability of the test apparatus 100 that has taken the measurement. This makes it possible to avoid a situation in which the device under measurement 120 that should be determined as a non-defective product in the first place is treated as defective and a yield is reduced, and a situation in which the device under measurement 120 that should be determined as defective in the first place is treated as a non-defective product and is moved to a next process, the situations being caused as a result of the measurement by the test apparatus 100 in which the error has occurred. Further, the analysis apparatus 130 according to the present embodiment separates, from the plurality of measured values, the component that depends on the measured position in the device under measurement 120, and the component that depends on the measured position in the jig 110, and thus the dispersion of the measured value can be extracted with a high precision.

Here, the machine learning unit 160 of the analysis apparatus 130 learns, by machine learning, the model of the component included in the measured value by using Bayesian inference. Instead of this, the machine learning unit 160 may learn by using another learning algorithm such as regression analysis, decision tree learning, and a neural network.

In general, Bayesian inference derives, from an observed fact, a probability of an event to be estimated. For example, if P(A) is a probability (a prior probability) of an event A occurring, and P(A/X) is a conditional probability (a posterior probability) of the event A occurring given that an event X occurred, the posterior probability P(A|X) is represented as follows by Bayes' theorem. Here, in statistics, P(X|A) is a likelihood, and in a case where a result appears depending on a certain precondition, represents the highest chance of conversely assuming what the precondition was in view of an observed result.

$$P(A \mid X) = \frac{P(X \mid A)P(A)}{P(X)} \qquad \text{[Math. 1]}$$

Here, from the viewpoint of the probability of the event A, P(X) has a meaning only as a normalization constant, and thus is often omitted, and the posterior probability P(A|X) can be represented as the following Expression. That is, the posterior probability P(A|X) is proportional to a product of the prior probability P(A) and the likelihood P(X|A).

$$P(A|X) \propto P(X|A)P(A) \qquad \text{[Math. 2]}$$

In this way, when a certain result relating to the event X is obtained, the probability of the event A is updated from the prior probability to posterior probability by reflecting the certain result and multiplying the likelihood. That is, by multiplying the prior probability P(A) which has a subjective probability distribution by the likelihood P(X|A), the posterior probability P(A|X) which has a more objective probability distribution is calculated with the event X being taken into account. Then, if a new event X is added, the posterior probability is treated as a new prior probability, and Bayesian revision is repeated. In this way, Bayesian inference is a method of estimating the event A by using Bayesian revision which makes the probability distribution more objective. As described above, the plurality of measured values obtained from the measurement system 10 are, for example, given as a sum of a plurality of components including the component that changes concentrically, the component that depends on the X axis direction, the component that depends on the Y axis direction, the component that depends on the number of times of the touchdowns, and the like. The machine learning unit 160 of the analysis apparatus 130 according to the present embodiment uses, as "A" in (Math. 1) and (Math. 2), a constant in a function of each component, that is, a constant W in a function of a distance r from the center of the device under measurement 120, a constant S in a function of an X axis component x and a Y axis component y, a constant R in a function of the number of times t of touchdowns, and the like, and uses, as "X" in (Math. 1) and (Math. 2), the values indicated by the plurality of measured values to update the probability distribution of each constant by using the measured values.

When learning the model of the component included in the measured value by machine learning, the machine learning unit 160 can use a simultaneous equation as a sampling method of obtaining an unknown parameter in a case where a plurality of parameters have a simple dependency relationship. Instead of this, in a case where the plurality of parameters depend on one another, the machine learning unit 160 can use an iterative method, a statistical estimation method, an optimization, and the like.

Figure 3:
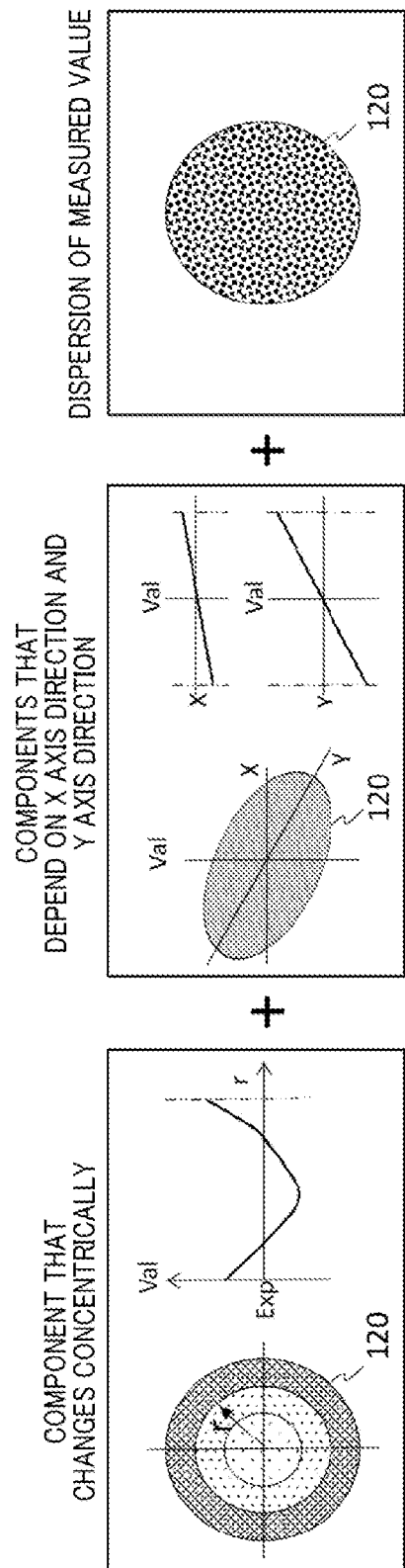
FIG. 3 shows an example of a component included in the measured value which is set as an analysis target by the analysis apparatus 130 according to the present embodiment.

FIG. 3 shows an example of a component included in the measured value which is set as an analysis target by the analysis apparatus 130 according to the present embodiment. The measured value which is analyzed by the analysis apparatus 130 includes the position-dependent component that depends on the measured position in the device under measurement 120. The position-dependent component includes, for example, the component that changes concentrically from the center of the device under measurement 120 as shown in this figure. When the plurality of device regions 122 are formed in the device under measurement 120 such as the wafer, a process may be performed by using a single wafer processing apparatus. In this single wafer processing apparatus, processing is carried out, in a state in which the wafer is held in a spin chuck and is rotated, by applying a treatment liquid from a nozzle to the center of the wafer so that the treatment liquid is spread over the entire wafer by centrifugal force due to the rotation of the spin chuck. At this time, it is not strictly easy to control the treatment liquid so as to be uniformly spread over the entire wafer, and to process an edge portion of the wafer similarly to the center portion. For such a reason, the device under measurement 120 has a slight manufacturing variation occurring concentrically depending on the distance from the center. Accordingly, the measured value which is analyzed by the analysis apparatus 130 includes the component that changes concentrically from the center of the device under measurement 120.

Further, for example as shown in this figure, the position-dependent component includes at least any one of a component that depends on one coordinate axis direction (the X axis direction) in a coordinate plane, and a component that depends on the other coordinate axis direction (the Y axis direction) in the coordinate plane, when the device under measurement 120 is arranged on the coordinate plane (the XY plane). For example, when the plurality of device regions 122 are formed in the device under measurement 120 such as a wafer, a process in which the wafer is gradually immersed in the treatment liquid from one end side, a process of filling a treatment chamber with a treatment gas from one end side of the wafer, or the like may be carried out. In such a case, the device under measurement 120 has the slight manufacturing variation from one end toward the other end. Accordingly, the measured value which is analyzed by the analysis apparatus 130 includes the component that depends on the X axis direction and the component that depends on the Y axis direction when the device under measurement 120 is arranged on the XY plane.

Further, in the final test, in a state in which an IC under measurement is mounted on each of the plurality of sockets provided on the socket board, the plurality of ICs under measurement are measured. In such a case, due to a warp, a tilt, temperature dependence, or the like of the socket board, the plurality of measured values include various components that depend on the measured position in the jig 110.

In this way, the plurality of measured values that are set as the analysis target by the analysis apparatus 130 include the position-dependent component that depends on a position with multidimensional variables, such as the component that changes concentrically, the component that depends on the X axis direction, and the component that depends on the Y axis direction. The analysis apparatus 130 according to the present embodiment can learn, by machine learning, the model of the position-dependent component with these multidimensional variables. Then, by separating the position-dependent component from the plurality of measured values, the analysis apparatus 130 according to the present embodiment can remove an influence on the measured value due to the manufacturing variation, and an influence on the measured value due to the position of the jig 110. This enables the analysis apparatus 130 according to the present embodiment to extract, in detail and with a high precision, the influence on the measured value which is caused by the dispersion of the measured value, and another factor.

Figure 4:
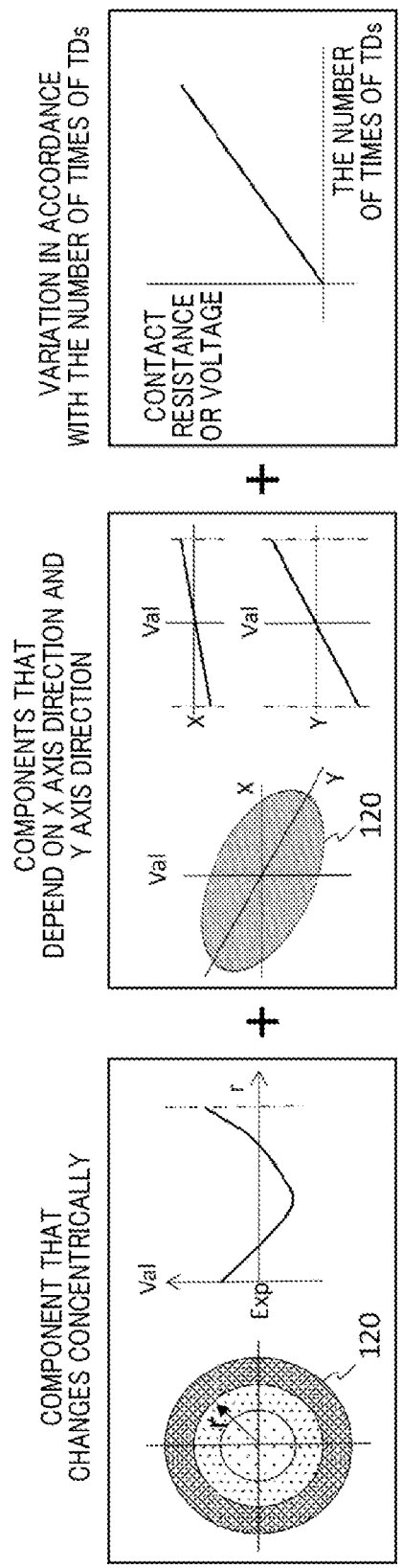
FIG. 4 shows another example of the component included in the measured value which is set as an analysis target by the analysis apparatus 130 according to the present embodiment.

FIG. 4 shows another example of the component included in the measured value which is set as an analysis target by the analysis apparatus 130 according to the present embodiment. In addition to the position-dependent component shown in FIG. 3, the measured value which is analyzed by the analysis apparatus 130 includes, as shown in this figure, a variation component of the measured value in accordance with the number of times of the touchdowns (TD) performed by the probe needle of the probe card 114 being brought into contact with the device under measurement 120.

As described above, when the electrical connection with the measurement target is made via the probe card 114, the contact is made so as to scratch the surface of the electrode pad by the probe needle. At this time, an oxide, debris, or the like on the electrode pad is attached to the needle tip of the probe needle. Thereby, a contact resistance (CRES) value of the probe needle increases in accordance with the number of times of the touchdowns, and as a result, the variation in accordance with the number of times of the touchdowns is given to the measured value. Note that the number of times of the touchdowns is a value which is reset when the needle tip of the probe needle is polished or washed by using the cleaning unit described above.

In addition to the position-dependent component including the component that changes concentrically, the component that depends on the X axis direction, and the component that depends on the Y axis direction, the analysis apparatus 130 according to the present embodiment can learn, by machine learning, the model of the component which includes the variation component in accordance with the number of times of the touchdowns and which is included in the measured value. Then, the analysis apparatus 130 can separate the position-dependent component from the plurality of measured values, and generate the variation data which indicates the variation of the measured value in accordance with the number of times of the touchdowns to manage the state of the jig based on the variation data.

Figure 5:
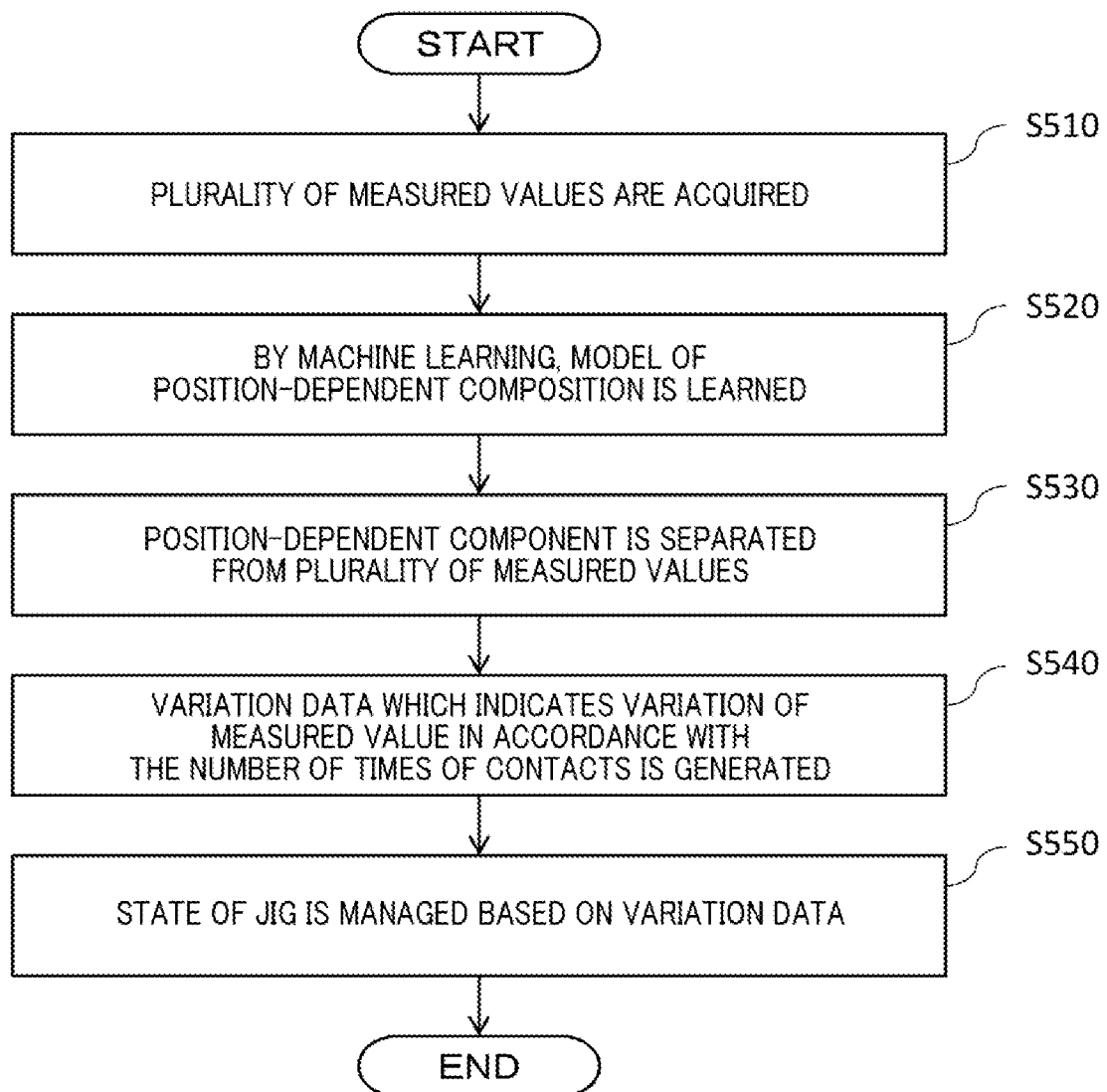
FIG. 5 shows a flow in which the analysis apparatus 130 according to the present embodiment manages a state of a jig 110 based on variation data.

FIG. 5 shows a flow in which the analysis apparatus 130 according to the present embodiment manages a state of a jig 110 based on variation data. Step 510 to step 530 are similar to step 210 to step 230 of FIG. 2.

In step 540 in this flow, the analysis unit 170 of the analysis apparatus 130 generates the variation data which indicates the variation of the measured value in accordance with the number of times of contacts that the jig 110 comes into contact with the device under measurement 120, that is, the number of times of the TDs. The analysis unit 170 classifies dispersions of the measured values by the number of times of the TDs, and represents each by the probability distribution. Further, the analysis unit 170 estimates a variance of the contact resistance of the jig 110 (the probe needle of the probe card 114) in accordance with the number of times of the TDs by using a plurality of probability distributions classified and generated by the number of times of the TDs.

Then, in step 550, the management unit 180 of the analysis apparatus 130 manages the state of the jig 110 based on the variation data generated in step 540. For example, the management unit 180 determines at least any one of the time to clean the jig 110 and the time to replace the jig 110 based on the variance of the contact resistance of the jig 110 in accordance with the number of times of the TDs.

Figure 6:
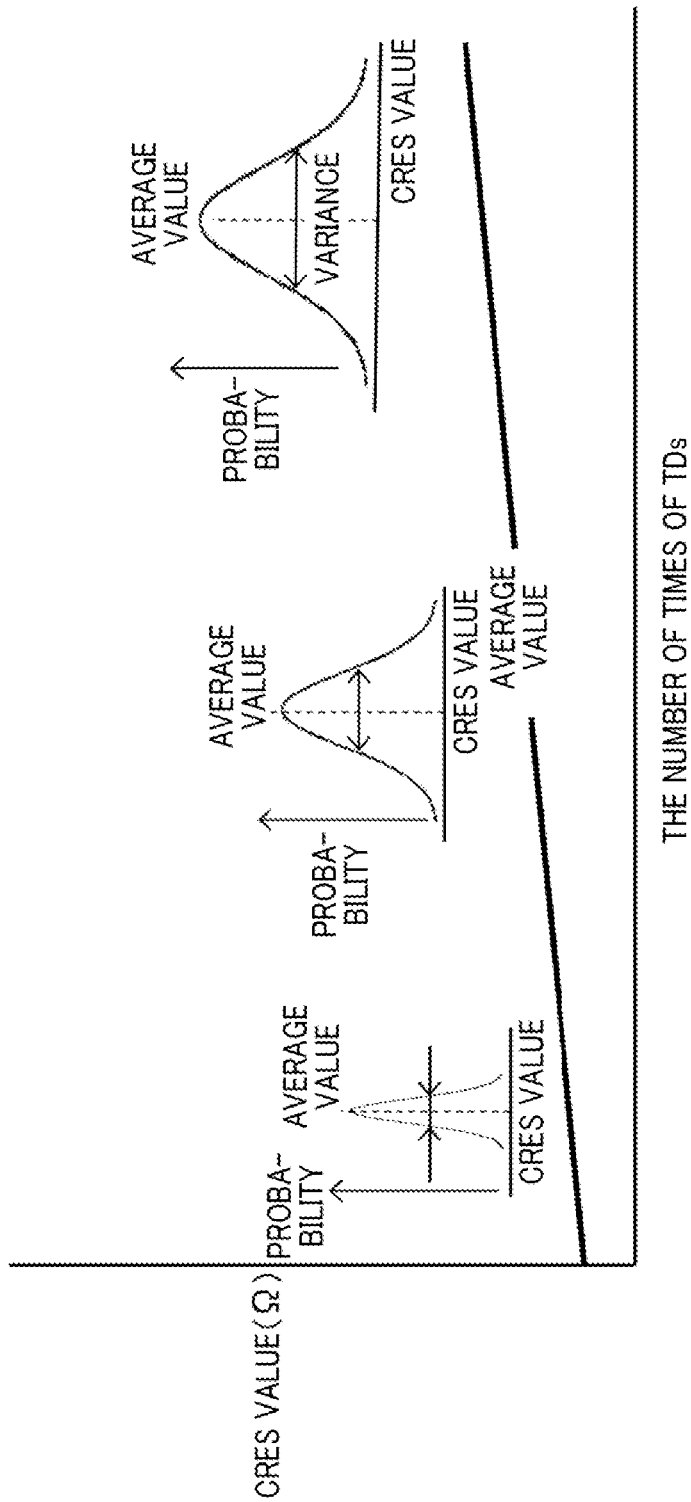
FIG. 6 shows a change tendency in contact resistance of the jig 110 in accordance with the number of times of contacts.

FIG. 6 shows a change tendency in contact resistance of the jig 110 in accordance with the number of times of contacts. As described above, the contact resistance (CRES) value of the probe needle increases according to the number of times of the TDs. Accordingly, as shown in this figure, when the number of times of the TDs is represented by a horizontal axis, an average value of the CRES value ever increases as the number of times of the TDs increases. In addition to this, the CRES value is found to show a tendency of the dispersion increasing as the number of times of the TDs increases. That is, in the probability distribution of the CRES value, the tendency shows that the variance increases as the number of times of the TDs increases. The analysis apparatus 130 according to the present embodiment uses this change tendency.

That is, the analysis apparatus 130 estimates, in step 540, the variance of the contact resistance in accordance with the number of times of the TDs and determines, in step 550, that the jig 110 needs to be cleaned when the variance of the contact resistance in accordance with the number of times of the TDs exceeds a predetermined criterion. Further, the analysis apparatus 130 determines, for example, the time to clean the jig 110 based on a degree that the variance of the contact resistance increases in accordance with the number of times of the TDs. That is, the analysis apparatus 130 may determine the time to clean the jig 110 assuming that the variance increases continuously in a similar manner (for example, linearly) based on the increase in the variance of the contact resistance in accordance with the number of times of the TDs. Further, the analysis apparatus 130 may determine the time to replace the jig 110 based on the variance of the contact resistance. For example, the analysis apparatus 130 may determine that the jig 110 needs to be replaced when the predetermined criterion is exceeded with the number of times of the TDs being smaller than the predetermined number of times.

With the analysis apparatus according to the present embodiment, the state of the jig 110 is managed based on the variation data which indicates the variation of the measured value in accordance with the number of times of contacts that the jig 110 comes into contact with the device under measurement 120, and thus maintenance of the jig 110 can be optimized. In the related art, the maintenance of the jig 110 has been performed regularly. However, the analysis apparatus according to the present embodiment can optimize the maintenance of the jig 110 based on the estimated contact resistance to reduce the number of times of the maintenance for the jig 110. This makes it possible to reduce the maintenance time, and to achieve a reduction of the time spent on the measurement and suppression of maintenance costs.

Various embodiments of the present invention may be described with reference to flowcharts and block diagrams, and blocks in the flowcharts and the block diagrams may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device. As a result, the computer-readable medium having instructions stored in the tangible device comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a Blu-ray (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk (registered trademark), JAVA (registered trademark), C++, etc., and conventional procedural programming languages, such as the "C" programming language or similar programming languages.

Computer-readable instructions may be provided to a processor of a general-purpose computer, special purpose computer, or other programmable data processing apparatus, or to programmable circuitry, locally or via a local area network (LAN), wide area network (WAN) such as the Internet, etc., so that the computer-readable instructions is executed to create means for performing operations specified in the flowcharts or block diagrams. Examples of processors include computer processors, processing units, microprocessors, digital signal processors, controllers, microcontrollers, etc.

Figure 7:
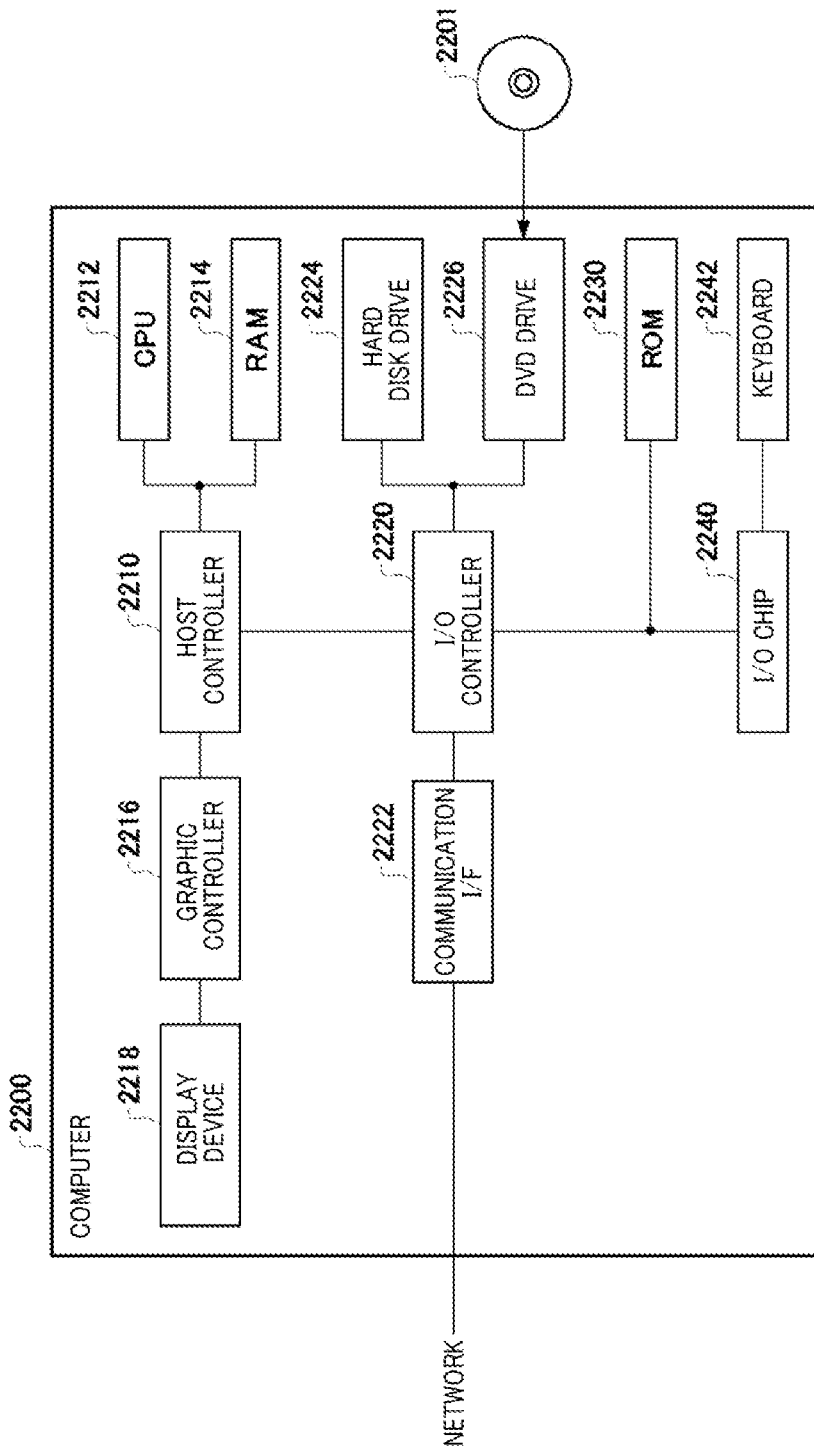
FIG. 7 shows an example of a computer 2200 in which a plurality of aspects of the present invention may be embodied entirely or partially.

FIG. 7 shows an example of a computer 2200 in which a plurality of aspects of the present invention may be embodied entirely or partially. A program that is installed in the computer 2200 can cause the computer 2200 to function for operations associated with an apparatus according to the embodiment of the present invention or as one or more sections in the apparatus, or cause the computer 2200 to perform the operations or the one or more sections thereof, and/or cause the computer 2200 to perform processes of the embodiment of the present invention or steps thereof. Such a program may be performed by a CPU 2212 so as to cause the computer 2200 to perform certain operations associated with some or all of the blocks of flowcharts and block diagrams described herein.

The computer 2200 according to the present embodiment includes the CPU 2212, a RAM 2214, a graphics controller 2216, and a display device 2218, which are interconnected by a host controller 2210. The computer 2200 also includes a communication interface 2222, a hard disk drive 2224, a DVD-ROM drive 2226, and an input/output unit such as an IC card drive, which are connected to the host controller 2210 via an input/output controller 2220. The computer also includes a ROM 2230 and a legacy input/output unit such as a keyboard 2242, which are connected to the input/output controller 2220 via an input/output chip 2240.

The CPU 2212 operates according to the programs stored in the ROM 2230 and the RAM 2214, thereby controlling each unit. The graphics controller 2216 acquires image data which is generated, by the CPU 2212, in a frame buffer or the like provided in the RAM 2214 or in itself so as to cause the image data to be displayed on the display device 2218.

The communication interface 2222 communicates with another electronic device via the network. The hard disk drive 2224 stores the program and data used by the CPU 2212 in the computer 2200. The DVD-ROM drive 2226 reads the program or the data from a DVD-ROM 2201, and provides the program or the data to the hard disk drive 2224 via the RAM 2214. The IC card drive reads the program and data from an IC card, and/or writes the program and data to the IC card.

The ROM 2230 stores, in itself, a boot program or the like that is executed by the computer 2200 during activation, and/or a program that depends on hardware of the computer 2200. Further, the input/output chip 2240 may connect various input/output units to the input/output controller 2220 via a parallel port, serial port, keyboard port, mouse port, or the like.

The program is provided by a computer-readable medium such as the DVD-ROM 2201 or the IC card. The program is read from the computer-readable medium, installed in the hard disk drive 2224, the RAM 2214, or the ROM 2230, which is also an example of the computer-readable medium, and executed by the CPU 2212. Information processing written in these programs is read by the computer 2200, resulting in cooperation between a program and various types of hardware resources described above. An apparatus or a method may be constituted by realizing the operation or processing of information in accordance with the usage of the computer 2200.

For example, when a communication is executed between the computer 2200 and an external device, the CPU 2212 may execute a communication program loaded in the RAM 2214, and instruct the communication interface 2222 to process the communication based on the processing written in the communication program. Under the control of the CPU 2212, the communication interface 2222 reads transmission data stored in a transmission buffering region provided in a recording medium such as the RAM 2214, the hard disk drive 2224, the DVD-ROM 2201 or the IC card, transmits the read transmission data to the network, or writes received data which is received from the network to a reception buffering region or the like provided on the recording medium.

Further, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. Then, the CPU 2212 writes back the processed data to the external recording medium.

Various types of information such as various types of programs, data, tables, and databases may be stored in recording media to undergo information processing. The CPU 2212 may execute various types of processing on the data read from the RAM 2214 to write back a result to the RAM 2214, the processing being described throughout the present disclosure, specified by an instruction sequence of the programs, and including various types of operations, processing of information, condition determinations, conditional branch, unconditional branch, information retrievals/replacements, or the like. Further, the CPU 2212 may search for information in the file, the database, or the like in the recording medium. For example, when a plurality of entries each having an attribute value of a first attribute associated with an attribute value of a second attribute are stored in the recording medium, the CPU 2212 may search, from among the plurality of entries, for an entry matching a condition in which the attribute value of the first attribute is specified, and read the attribute value of the second attribute stored in the entry, thereby acquiring the attribute value of the second attribute associated with the first attribute that satisfies a predetermined condition.

The program or software module described above may be stored on the computer 2200 or in a computer-readable medium near the computer 2200. Further, a recording medium such as a hard disk or a RAM provided in a server system connected to a dedicated communication network or the Internet can be used as the computer-readable medium, thereby providing the program to the computer 2200 via the network.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: test apparatus
102: tester main body
104: test head
110: jig
112: performance board
114: probe card
116: prober
120: device under measurement
122: device region
130: analysis apparatus
140: input unit
150: acquisition unit
160: machine learning unit
170: analysis unit
180: management unit
190: output unit
2200: computer
2201: DVD-ROM
2210: host controller
2212: CPU
2214: RAM
2216: graphics controller
2218: display device
2220: input/output controller
2222: communication interface
2224: hard disk drive
2226: DVD-ROM drive
2230: ROM
2240: input/output chip
2242: keyboard

What is claimed is:

1. An analysis apparatus comprising:
at least one processor;
an acquisition unit that acquires a plurality of measured values obtained by measuring at least one device under measurement via a jig using the at least one processor;
an analysis unit that analyzes the plurality of measured values to calculate variation data which indicates a variation of a measured value according to the number of times the jig has come into contact with the at least one device under measurement using the at least one processor; and
a management unit that performs a management action on the jig based on the variation data using the at least one processor,
wherein the management unit performs the management action on the jig by at least one of cleaning the jig or replacing the jig based on the variation data.

2. The analysis apparatus according to claim 1, wherein the acquisition unit acquires the plurality of measured values which are measured at different positions in the at least one device under measurement, and
the analysis unit separates, from the plurality of measured values, a position-dependent component that depends on a measured position in the at least one device under measurement, and to extract the variation of the measured value in accordance with the number of times the jig has come into contact with the at least one device under measurement.

3. The analysis apparatus according to claim 2, wherein the position-dependent component includes a component that changes concentrically from the center of the at least one device under measurement.

4. The analysis apparatus according to claim 3, wherein the position-dependent component includes at least any one of a component that depends on one coordinate axis direction in a coordinate plane, and a component that depends on the other coordinate axis direction in the coordinate plane, when the at least one device under measurement is arranged on the coordinate plane.

5. The analysis apparatus according to claim 3, wherein the at least one device under measurement is a wafer in which a plurality of device regions are formed, and
the acquisition unit acquires at least any one of the plurality of measured values obtained by measuring each of the device regions, and the plurality of measured values obtained by measuring each of region blocks including the plurality of device regions.

6. The analysis apparatus according to claim 3, further comprising:
a machine learning unit that uses the plurality of measured values to learn, by machine learning, a model of the position-dependent component using the at least one processor,
wherein the analysis unit separates the position-dependent component which is calculated by using the model learned by the machine learning unit.

7. The analysis apparatus according to claim 3, wherein the analysis unit analyzes the plurality of measured values to estimate a contact resistance of the jig, and
the management unit performs the management action on the jig based on the contact resistance of the jig estimated by the analysis unit.

8. The analysis apparatus according to claim 2, wherein the position-dependent component includes at least any one of a component that depends on one coordinate axis direction in a coordinate plane, and a component that depends on the other coordinate axis direction in the coordinate plane, when the at least one device under measurement is arranged on the coordinate plane.

9. The analysis apparatus according to claim 8, wherein the at least one device under measurement is a wafer in which a plurality of device regions are formed, and
the acquisition unit acquires at least any one of the plurality of measured values obtained by measuring each of the device regions, and the plurality of measured values obtained by measuring each of region blocks including the plurality of device regions.

10. The analysis apparatus according to claim 8, further comprising:
a machine learning unit that uses the plurality of measured values to learn, by machine learning, a model of the position-dependent component using the at least one processor,
wherein the analysis unit separates the position-dependent component which is calculated by using the model learned by the machine learning unit.

11. The analysis apparatus according to claim 2, wherein
the at least one device under measurement is a wafer in which a plurality of device regions are formed, and
the acquisition unit acquires at least any one of the plurality of measured values obtained by measuring each of the device regions, and the plurality of measured values obtained by measuring each of region blocks including the plurality of device regions.

12. The analysis apparatus according to claim 2, further comprising:
a machine learning unit that uses the plurality of measured values to learn, by machine learning, a model of the position-dependent component using the at least one processor,
wherein the analysis unit separates the position-dependent component which is calculated by using the model learned by the machine learning unit.

13. The analysis apparatus according to claim 2, wherein
the analysis unit analyzes the plurality of measured values to estimate a contact resistance of the jig, and
the management unit performs the management action on the jig based on the contact resistance of the jig estimated by the analysis unit.

14. The analysis apparatus according to claim 1,
wherein the at least one device under measurement includes a plurality of devices under measurement, and
the acquisition unit acquires the plurality of measured values obtained by measuring the at least one device under measurement at different positions in the jig, and
the analysis unit separates, from the plurality of measured values, a position-dependent component that depends on a measured position in the jig, and to extract the variation of the measured value in accordance with the number of times the jig has come into contact with the at least one device under measurement.

15. The analysis apparatus according to claim 1, wherein
the analysis unit analyzes the plurality of measured values to estimate a contact resistance of the jig, and
the management unit performs the management action on the jig based on the contact resistance of the jig estimated by the analysis unit.

16. The analysis apparatus according to claim 15, wherein
the analysis unit analyzes the plurality of measured values to calculate a variance of the contact resistance in accordance with the number of times the jig has come into contact with the at least one device under measurement, and
the management unit performs the management action on the jig based on the variance of the contact resistance which is calculated by the analysis unit and is in accordance with the number of times the jig has come into contact with the at least one device under measurement.

17. An analysis method in which an analysis apparatus performs an analysis using at least one process, the analysis method comprising:
acquiring, by the analysis apparatus, a plurality of measured values obtained by measuring at least one device under measurement via a jig using the at least one processor;
analyzing, by the analysis apparatus, the plurality of measured values to generate variation data which indicates a variation of a measured value according to the number of times the jig has come into contact with the at least one device under measurement using the at least one processor; and
performing, by the analysis apparatus, a management action on the jig based on the variation data using the at least one processor,
wherein the performing the management action on the jig is at least one of cleaning the jig or replacing the jig based on the variation data.

18. A non-transitory recording medium having recorded thereon an analysis program that is executed by a computer and causes the computer to function as:
an acquisition unit that acquires a plurality of measured values obtained by measuring at least one device under measurement via a jig by the computer;
an analysis unit that analyzes the plurality of measured values to generate variation data which indicates a variation of a measured value according to the number of times the jig has come into contact with the at least one device under measurement by the computer; and
a management unit that performs a management action on the jig based on the variation data by the computer,
wherein the management unit performs the management action on the jig by at least one of cleaning the jig or replacing the jig based on the variation data.

* * * * *